United States Patent
Voegeli et al.

(10) Patent No.: US 10,707,768 B2
(45) Date of Patent: Jul. 7, 2020

(54) POWER MODULE FOR MEDIUM AND HIGH-VOLTAGE FREQUENCY CONVERTER AND FREQUENCY CONVERTER COMPRISING SAME

(71) Applicant: ABB Schweiz AG, Baden (CH)

(72) Inventors: Andreas Voegeli, Beijing (CN); Shen Luo, Beijing (CN)

(73) Assignee: ABB Schweiz AG, Baden (CH)

( * ) Notice: Subject to any disclaimer, the term of this patent is extended or adjusted under 35 U.S.C. 154(b) by 116 days.

(21) Appl. No.: 14/889,179

(22) PCT Filed: Oct. 12, 2013

(86) PCT No.: PCT/CN2013/085122
§ 371 (c)(1),
(2) Date: Nov. 5, 2015

(87) PCT Pub. No.: WO2014/187064
PCT Pub. Date: Nov. 27, 2014

(65) Prior Publication Data
US 2016/0149506 A1    May 26, 2016

(30) Foreign Application Priority Data
May 22, 2013    (CN) ............... 2013 2 0283733 U

(51) Int. Cl.
*H02M 5/40*    (2006.01)
*H05K 7/14*    (2006.01)
(Continued)

(52) U.S. Cl.
CPC ............ *H02M 5/40* (2013.01); *H05K 5/0217* (2013.01); *H05K 7/1432* (2013.01);
(Continued)

(58) Field of Classification Search
CPC .... H05K 1/41; H05K 1/0231; H01L 23/2393; H02M 3/21; H02M 3/33507; H02M 5/4585; H02M 7/003
(Continued)

(56) References Cited

U.S. PATENT DOCUMENTS 5,907,475 A * 5/1999 Babinski ............... H05K 7/209
                                                         361/719
6,091,604 A * 7/2000 Plougsgaard ......... H02M 7/003
                                                         165/185
(Continued)

FOREIGN PATENT DOCUMENTS

CN    2591859 Y    12/2003
CN    1635682 A    7/2005
(Continued)

OTHER PUBLICATIONS

ISA/CN International Search Report dated Feb. 13, 2014 re PCT Application No. PCT/CN2013/085122, filed Oct. 12, 2013.
(Continued)

*Primary Examiner* — Tuan T Dinh
(74) *Attorney, Agent, or Firm* — J. Bruce Schelkopf; Taft Stettinius & Hollister LLP

(57) ABSTRACT

A power module for medium and high-voltage frequency converter and a frequency converter comprising same. The power module has a three-phase alternating current input and a single-phase alternating current output, and comprises a circuit board (100), a rectifying module (120), a capacitor bank (130), and an inverting module (140), wherein the rectifying module, the capacitor bank and the inverting module are all mounted on the circuit board. The power module has a compact structure and is convenient to cool.

14 Claims, 3 Drawing Sheets

(51) Int. Cl.
*H05K 5/02* (2006.01)
*H05K 7/20* (2006.01)
*H02M 7/00* (2006.01)
*H02M 5/458* (2006.01)

(52) U.S. Cl.
CPC ......... *H05K 7/20009* (2013.01); *H02M 5/458* (2013.01); *H02M 7/003* (2013.01)

(58) Field of Classification Search
USPC .................. 361/710–715, 752, 775–784
See application file for complete search history.

(56) References Cited

U.S. PATENT DOCUMENTS

| | | | | |
|---|---|---|---|---|
| 6,259,617 | B1* | 7/2001 | Wu | H02M 7/003 257/724 |
| 6,265,656 | B1 | 7/2001 | Berth | |
| 6,493,249 | B2* | 12/2002 | Shirakawa | H02M 7/003 363/147 |
| 6,552,912 | B1 | 4/2003 | Kanazawa et al. | |
| 6,665,183 | B1* | 12/2003 | Shikata | H05K 7/20918 257/721 |
| 6,824,393 | B2* | 11/2004 | Debord | H05K 1/14 361/788 |
| 7,830,111 | B2* | 11/2010 | Aiello | H02M 7/003 320/103 |
| 7,974,101 | B2* | 7/2011 | Azuma | B60K 6/28 361/501 |
| 8,008,923 | B2* | 8/2011 | Hammond | H01M 10/44 320/116 |
| 10,624,243 | B2* | 4/2020 | Aitzetmueller | H05K 7/20918 |
| 2002/0017893 | A1* | 2/2002 | Duff, Jr. | H01G 9/155 320/100 |
| 2002/0024828 | A1* | 2/2002 | Hayashi | H02M 5/4505 363/35 |
| 2002/0140290 | A1* | 10/2002 | Goto | B60L 1/00 307/10.1 |
| 2002/0153371 | A1* | 10/2002 | Oshima | H05B 6/642 219/757 |
| 2007/0048561 | A1 | 3/2007 | Aiello et al. | |
| 2007/0211443 | A1* | 9/2007 | Wechter | H05K 3/308 361/782 |
| 2009/0066289 | A1* | 3/2009 | Vogel | H02J 7/00 320/107 |
| 2009/0128083 | A1* | 5/2009 | Zargari | H02J 3/1892 318/801 |
| 2011/0075359 | A1* | 3/2011 | Field | H03F 3/217 361/695 |
| 2011/0122669 | A1* | 5/2011 | Santos | H02M 7/003 363/141 |
| 2011/0222244 | A1* | 9/2011 | Takashiro | H02M 7/003 361/704 |
| 2012/0163057 | A1* | 6/2012 | Permuy | H02M 7/487 363/131 |
| 2012/0186888 | A1* | 7/2012 | Ross | B60K 1/02 180/65.31 |
| 2012/0327602 | A1* | 12/2012 | Kulkarni | H02M 7/003 361/700 |
| 2013/0100716 | A1* | 4/2013 | Tong | H02M 1/32 363/37 |
| 2014/0022738 | A1 | 1/2014 | Hiller et al. | |

FOREIGN PATENT DOCUMENTS

| | | |
|---|---|---|
| CN | 1925289 A | 3/2007 |
| CN | 200956554 Y | 10/2007 |
| CN | 100463338 C | 2/2009 |
| CN | 101420173 A | 4/2009 |
| CN | 101499714 A | 8/2009 |
| CN | 201303286 Y | 9/2009 |
| CN | 201398147 Y | 2/2010 |
| CN | 201435684 Y | 3/2010 |
| CN | 101183833 B | 6/2010 |
| CN | 201577024 U | 9/2010 |
| CN | 201608630 U | 10/2010 |
| CN | 201616766 U | 10/2010 |
| CN | 201674385 U | 12/2010 |
| CN | 201726303 U | 1/2011 |
| CN | 201805346 U | 4/2011 |
| CN | 201805347 U | 4/2011 |
| CN | 202103560 U | 1/2012 |
| CN | 103066859 A | 4/2013 |
| CN | 202856626 U | 4/2013 |
| DE | 19841134 | 3/2000 |
| DE | 102011006987 | 10/2012 |
| GB | 2418783 | 4/2006 |
| WO | 2008005486 A2 | 1/2008 |

OTHER PUBLICATIONS

Canadian First Office Action; Canadian Intellectual Property Office; Canadian Patent Application No. 2,912,475; dated Nov. 28, 2016; 3 pgs.
Extended European Search Report in EP13885201.7; dated Dec. 8, 2016; 6 pgs.
Office Action for Canadian Patent Application No. 2,912,475, dated Jul. 4, 2017, 4 pages.
Canadian Intellectual Property Office, Office Action dated Jun. 6, 2018 issued in counterpart Canadian application No. 2,912,475, 4 pp.
Intellectual Property India, The Patent Office, Examination Report dated Jul. 18, 2018 issued in counterpart Indian application No. 6372/CHENP/2015, 6 pp.
Canadian Intellectual Property Office, Office Action and Examination Search Report in corresponding Application No. 2,912,475, dated Jun. 19, 2019, 3 pp.
National Institute of Industrial Property Brazil, Office Action in corresponding application No. BR112015027997-0, dated Dec. 9, 2019, 4 pp.

* cited by examiner

POWER MODULE FOR MEDIUM AND HIGH-VOLTAGE FREQUENCY CONVERTER AND FREQUENCY CONVERTER COMPRISING SAME

FIELD OF INVENTION

The present application relates to a power module for medium and high-voltage frequency converter, and more specifically, relates to a power module for medium and high-voltage frequency converter with three-phase AC input and single-phase AC output. The present application also relates to a converter including the power module.

BACKGROUND OF INVENTION

Power module is an integrated component or module capable of processing electricity, and it is integrated by different components and technology according to optimum electrical circuit structure and system structure. Multiple power modules can work together to constitute a power electronics system, so as to achieve systematic functions such as voltage transformation, energy storage and conversion, and impedance matching. For medium and high-voltage frequency converter, multiple power modules in a cabinet are usually connected in series to regulate power. In order to make the system structure compact, it is necessary to compact the structure of power module in the cabinet while optimizing cooling of the power module.

SUMMARY OF INVENTION

The present application provides a power module for medium and high-voltage frequency converter, having a three-phase AC input and a single-phase AC output, characterized in that the power module includes a circuit board, a rectifying module, a capacitor bank, and an inverting module, wherein the rectifying module, the capacitor bank and the inverting module are all mounted on the circuit board.

In one embodiment, at least part of capacitors in the capacitor bank are welded on the circuit board.

In one embodiment, the power module further includes a control board mounted on the circuit board.

In one embodiment, in use, capacitors in the capacitor bank stand on the circuit board.

In one embodiment, the power module further includes a supporting structure for supporting the circuit board.

In one embodiment, the power module further includes a housing with a recess provided at rear end thereof.

In one embodiment, the housing is further provided with a positioner thereon.

In one embodiment, the circuit board is further provided with a relay and a charging resistor thereon.

In one embodiment, the power module further includes at least two fuses arranged in parallel with the circuit board and in parallel with each other.

In one embodiment, in use, air flows through the rectifying module, the capacitor bank and the inverting module in order, to have them cooled.

In one embodiment, the power module is further provided with an auxiliary computer.

The above structure can make the power module more compact and reduce spurious emission interference, thus make the module more efficient. In addition, the structure is beneficial for cooling the rectifying module, the capacitor bank and the inverting module. Further, through this structure, the capacitor bank and the circuit board can be securely fastened, increasing the reliability of the power module.

The present application further provides a converter, characterized by including the power module according to any one of above.

DETAILED DESCRIPTION OF EMBODIMENTS

Detailed description of embodiments of present application is given below with reference to the drawings.

Figure 1:
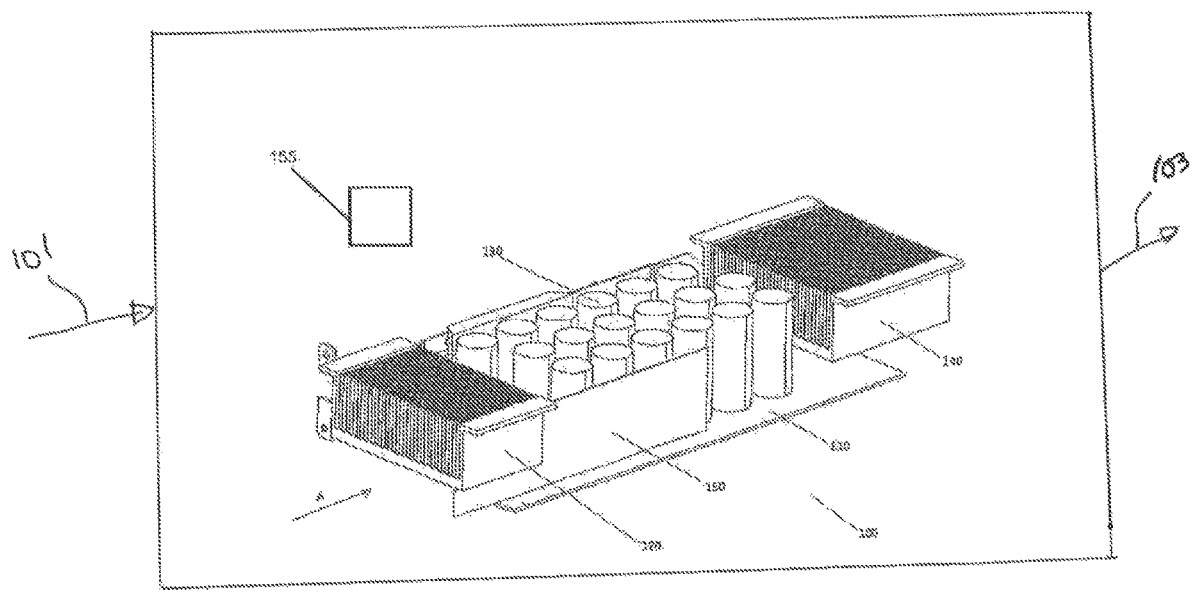
FIG. 1 shows a schematic view of internal structure of a power module according to one embodiment of present application.

FIG. 1 shows an internal structure of a power module having three-phase AC input 101 and single-phase AC output 103. The power module includes a power assembly 100 and a housing 300 (see FIG. 3 and FIG. 5). The power assembly 100 includes a circuit board 110, and a rectifying module 120, a capacitor bank 130, and an inverting module 140 mounted on the circuit board 110, and a control board 150 inserted on the circuit board 110. The rectifying module for example can be a six-pulse rectifier bridge, the inverting module for example can be an H-bridge IGBT, and the control board 150 can be provided with a main controller etc. to control the power module. In addition, the power module can be further provided with an auxiliary computer 155 to provide redundancy and backup for the main controller.

Mounting the rectifying module 120, the capacitor bank 130, and the inverting module 140 on the same circuit board 110 can make the structure more compact and reduce spurious emission interference, thus make the module more efficient. In addition, the structure is beneficial for cooling the rectifying module, the capacitor bank and the inverting module. As shown by arrow A in FIG. 1, the cooling air flows through the rectifying module, the capacitor bank and the inverting module in order, to effectively cool the module. Further, through this structure, the capacitor bank 130 can stand upright on the circuit board 110 instead of being cantilevered when the power module is installed into a converter, thus securely fastening the capacitor bank 130 and the circuit board 110 and increasing the reliability of the power module.

The capacitor bank includes certain number of electrolytic capacitors, every three of which are connected in series to form a sub-group, and all sub-groups are connected in parallel. Preferably, all these capacitors have snap-in terminal and are welded onto the circuit board 110. Comparing with traditional mounting using screws, it is more efficient and allows use of many small size capacitors to increase capacitor surface area and improve heat dissipation. Further, welded capacitor is hard to get loosed and thus module reliability can be increased.

Figure 2:
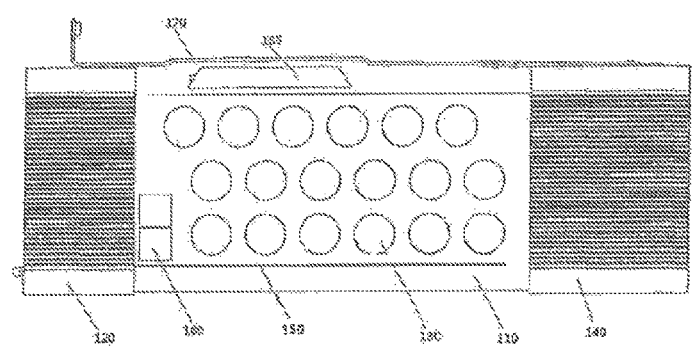
FIG. 2 shows a front view of internal structure of a power module according to one embodiment of present application.

As shown in FIG. 2, the power module can also include a relay 160 and a charging resistor 165 mounted on the circuit board 110, and the relay 160 is used to bypass the charging resistor 165. The circuit board 110 can also be provided with an equalizing resistance (not shown) to balance the voltage between those capacitors connected in series.

Figure 3:
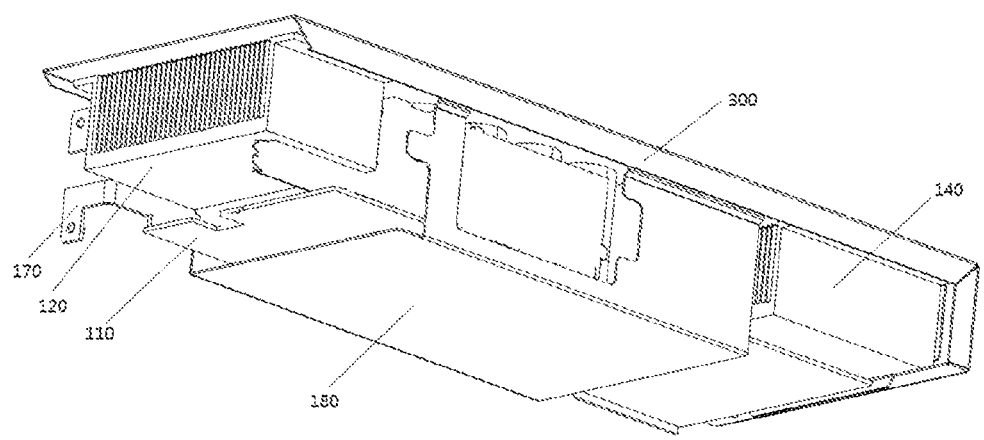
FIG. 3 shows a schematic view of internal structure and its supporting structure, and partial housing of a power module according to one embodiment of present application.
Figure 4:
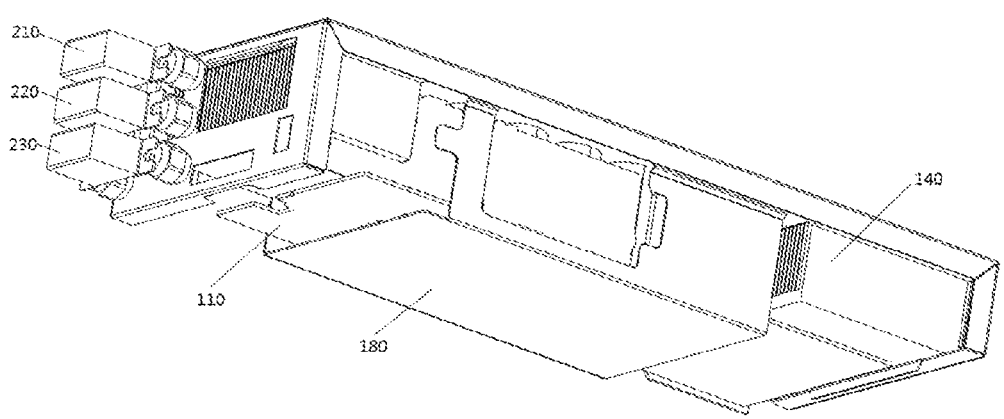
FIG. 4 shows a schematic view of internal structure of a power module according to another embodiment of present application.

FIG. 3 and FIG. 4 show the supporting structure 180 of the power assembly 100. Since the rectifying module, the capacitor bank, and the inverting module are all mounted on the same circuit board 110, the circuit board 110 is heavily loaded. In order to protect the circuit board 100 from being damaged, the present application proposes a supporting structure 180 to support the whole power assembly 100. As shown in FIG. 3 and FIG. 4, the supporting structure 180 is in U-shape, to support the circuit board 110 along its width direction and connect with housing 300 of the power module. Certainly, it should be understood that the supporting structure 180 can be in other form based on the supporting requirement and shall be not be limited to the drawings as shown. For example, the supporting structure 180 can support the circuit board 110 from its two sides in the way of cantilever.

FIG. 4 shows a schematic view of a power module according to another embodiment of present application. As shown in FIG. 4, besides the above described structure, the power module further includes three fuses 210, 220 and 230 which are arranged in parallel with the circuit board and in parallel with each other. As shown, the three fuses are stacked in the direction perpendicular with the circuit board, and they are used for protecting the semiconductor components in the power module from being damaged.

Figure 5:
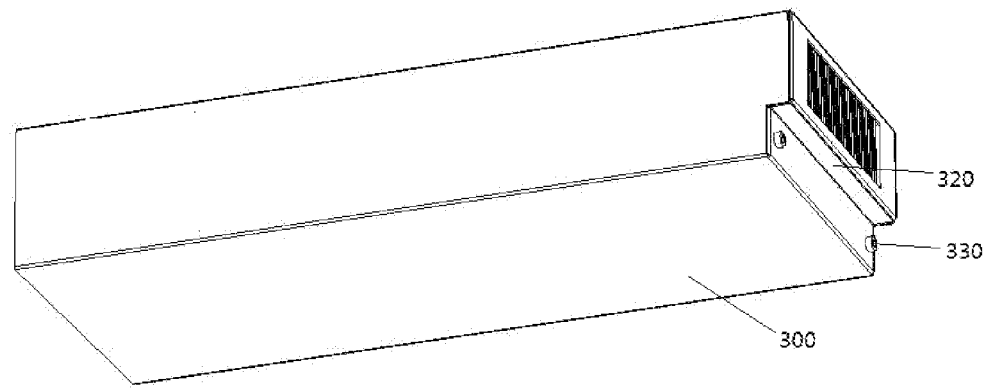
FIG. 5 shows a schematic view of external structure of a power module according to one embodiment of present application.
Figure 6:
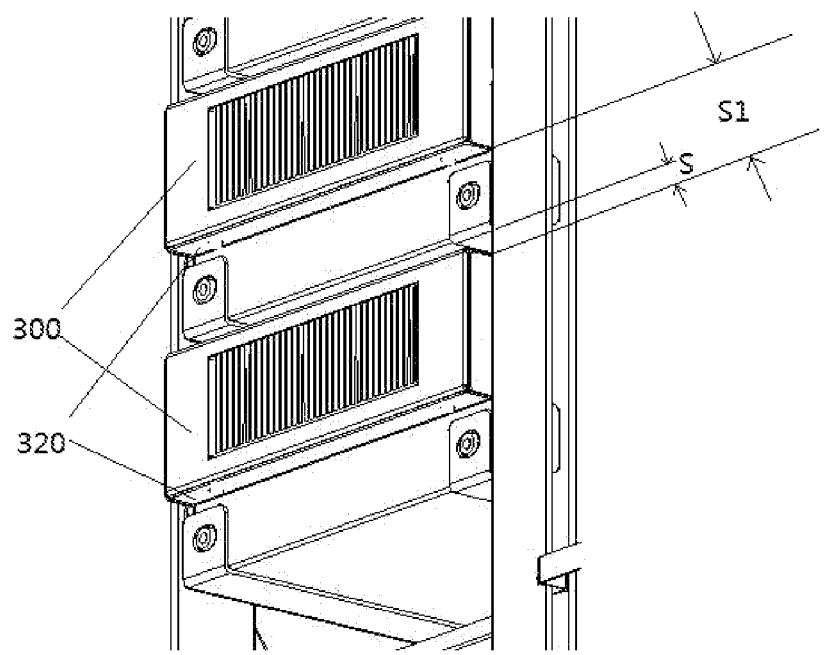
FIG. 6 shows an assembled view of a power module according to one embodiment of present application.

FIG. 5 schematically shows the external structure of a power module according to one embodiment of present application, while FIG. 6 shows the assembled structure of two power modules. In order to compact the design of whole converter, distance between power modules needs to be reduced. However, the distance cannot be too short due to the requirement of clearance and creepage. Therefore, by restructuring the power module, the present application proposes a structure which can compactly arrange power modules while meeting the requirement of clearance and creepage. As shown in FIG. 5 and FIG. 6, a recess 320 is provided at rear end of the housing 300, so the creepage distance can be increased from S to S1 with same arrangement of power modules. In addition, a positioner 330 can be provided on the housing 300 to accurately position the power module. The positioner 330 can engage with a corresponding positioner on cabinet when the power module is installed into the cabinet. The positioner 330 can be for example two protrusions while the corresponding positioners on the cabinet can be two grooves. The positioner 330 can also be a plate extending beyond the housing while the corresponding positioner on the cabinet can be a stopper for preventing the power module from vibrating.

The present application also provides a converter including any one of the above described power module.

Though the present invention has been described on the basis of some preferred embodiments, those skilled in the art should appreciate that those embodiments should by no way limit the scope of the present invention. Without departing from the spirit and concept of the present invention, any variations and modifications to the embodiments should be within the apprehension of those with ordinary knowledge and skills in the art, and therefore fall in the scope of the present invention which is defined by the accompanied claims.

The invention claimed is:

1. A power module for medium and high-voltage frequency converter, having a three-phase AC input and a single-phase AC output, comprising:
    a circuit board; a rectifying module; a capacitor bank; and an inverting module; wherein the rectifying module, the capacitor bank, and the inverting module are all directly mounted on the circuit board and arranged such that a cooling air flows, in order, through the rectifying module, the capacitor bank, and the inverting module, and wherein the power module further comprises a control board vertically mounted on the circuit board along a flow direction of the cooling air and a supporting structure for supporting the circuit board.

2. The power module according to claim 1, wherein the capacitor bank includes capacitors and at least part of the capacitors in the capacitor bank are welded on the circuit board.

3. The power module according to claim 1, wherein active capacitors in the capacitor bank are configured to stand on the circuit board.

4. The power module according to claim 1 further including: a housing with a recess provided at the rear end thereof.

5. The power module according to claim 1, wherein the circuit board further includes a relay and a charging resistor thereon.

6. The power module according to claim 1, including: at least two fuses arranged in parallel with the circuit board and in parallel with each other.

7. The power module according to claim 1, wherein the rectifying module, the capacitor bank and the inverting module are configured for cooling air flow.

8. The power module according to claim 1 further including: an auxiliary computer.

9. A converter including the power module according to claim 1.

10. The power module according to claim 4, wherein the housing further includes a positioner thereon.

11. A power module for a medium or high-voltage frequency converter, comprising:
    a circuit board;
    a rectifying module directly mounted on the circuit board;
    a capacitor bank directly mounted on the circuit board;
    an inverting module directly mounted on the circuit board,
    wherein the power module includes a three-phase AC input and a single-phase AC output,
    wherein the power module is arranged such that a cooling air flows, in order, through the rectifying module, the capacitor bank, and the inverting module, and
    wherein the power module further comprises a control board vertically mounted on the circuit board along a flow direction of the cooling air and a supporting structure for supporting the circuit board.

12. The power module according to claim 11, wherein the capacitor bank includes capacitors welded on the circuit board.

13. The power module according to claim 11, wherein the capacitor bank includes capacitors configured to stand on the circuit board.

14. The power module according to claim 11, wherein the circuit board further includes a relay and a charging resistor.

* * * * *